United States Patent
Lee et al.

(10) Patent No.: US 9,638,378 B2
(45) Date of Patent: *May 2, 2017

(54) LIGHT EMITTING APPARATUS

(71) Applicant: LG INNOTEK CO., LTD, Seoul (KR)

(72) Inventors: Sang Won Lee, Seoul (KR); Gyu Hyeong Bak, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/855,658

(22) Filed: Sep. 16, 2015

(65) Prior Publication Data

US 2016/0003421 A1    Jan. 7, 2016

Related U.S. Application Data

(63) Continuation of application No. 14/338,812, filed on Jul. 23, 2014, which is a continuation of application (Continued)

(30) Foreign Application Priority Data

Nov. 20, 2009    (KR) .................. 10-2009-0112479

(51) Int. Cl.
*H01L 33/00* (2010.01)
*F21K 99/00* (2016.01)
(Continued)

(52) U.S. Cl.
CPC ................. *F21K 9/50* (2013.01); *F21K 9/60* (2016.08); *F21V 5/04* (2013.01); *G02B 19/0014* (2013.01);
(Continued)

(58) Field of Classification Search
CPC ....................................................... H01L 33/58
(Continued)

(56) References Cited

U.S. PATENT DOCUMENTS 5,526,190 A    6/1996    Hubble et al.
5,701,207 A    12/1997    Waketa et al.
(Continued)

FOREIGN PATENT DOCUMENTS

CN    1904650 A    1/2007
CN    101150159 A    3/2008
(Continued)

OTHER PUBLICATIONS

U.S. Office Action for U.S. Appl. No. 14/338,812 dated Dec. 18, 2015.
(Continued)

*Primary Examiner* — Jerome Jackson, Jr.
(74) *Attorney, Agent, or Firm* — Ked & Associates LLP

(57) ABSTRACT

Provided is a light emitting apparatus. The light emitting apparatus includes a substrate; a light emitting device on the substrate; a fluorescent layer formed on the substrate and the light emitting device to surround the light emitting device; an encapsulant resin layer formed on the substrate and the fluorescent layer to surround the fluorescent layer; and a lens disposed on the light emitting device and supported by the substrate, wherein the lens includes a lens body having a first recess formed at a center of a top surface of the lens body and a second recess formed at a center of a bottom surface of the lens body, and a lens supporter provided at the bottom surface of the lens body to support the lens body such that the lens body is spaced apart from the substrate.

20 Claims, 4 Drawing Sheets

Related U.S. Application Data

No. 13/759,564, filed on Feb. 5, 2013, now Pat. No. 8,823,048, which is a continuation of application No. 12/949,915, filed on Nov. 19, 2010, now Pat. No. 8,395,183.

(51) Int. Cl.

| | | |
|---|---|---|
| H01L 33/58 | (2010.01) | |
| G02B 19/00 | (2006.01) | |
| H01L 33/50 | (2010.01) | |
| H01L 33/52 | (2010.01) | |
| F21V 5/04 | (2006.01) | |
| H01L 33/56 | (2010.01) | |
| F21K 9/60 | (2016.01) | |
| H01L 33/32 | (2010.01) | |
| B82Y 20/00 | (2011.01) | |
| F21Y 101/00 | (2016.01) | |

(52) U.S. Cl.
CPC ..... *G02B 19/0066* (2013.01); *G02B 19/0071* (2013.01); *H01L 33/50* (2013.01); *H01L 33/52* (2013.01); *H01L 33/56* (2013.01); *H01L 33/58* (2013.01); *B82Y 20/00* (2013.01); *F21Y 2101/00* (2013.01); *H01L 33/32* (2013.01); *H01L 2924/0002* (2013.01)

(58) Field of Classification Search
USPC .......................................................... 257/4
See application file for complete search history.

(56) References Cited

U.S. PATENT DOCUMENTS

| | | |
|---|---|---|
| 6,610,563 B1 | 8/2003 | Waitl et al. |
| 6,617,786 B1 | 9/2003 | Centafante |
| 6,670,207 B1 | 12/2003 | Roberts |
| 6,724,543 B1 | 4/2004 | Chinniah et al. |
| 6,813,096 B2 | 11/2004 | Ohta |
| 7,119,964 B2 | 10/2006 | Kim et al. |
| 7,549,781 B2 | 6/2009 | Kim et al. |
| 7,570,437 B2 | 8/2009 | Gal et al. |
| 7,602,559 B2 | 10/2009 | Jang et al. |
| 8,052,307 B2 | 11/2011 | Bak et al. |
| 8,213,093 B2 | 7/2012 | Bak et al. |
| 2002/0163810 A1 | 11/2002 | West et al. |
| 2004/0207999 A1 | 10/2004 | Suehiro et al. |
| 2004/0223315 A1 | 11/2004 | Suehiro et al. |
| 2006/0138437 A1 | 6/2006 | Huang et al. |
| 2007/0024990 A1 | 2/2007 | Paek et al. |
| 2007/0041210 A1 | 2/2007 | Ikuno et al. |
| 2007/0099316 A1 | 5/2007 | Lee et al. |
| 2007/0195534 A1 | 8/2007 | Ha |
| 2007/0228390 A1 | 10/2007 | Hattori et al. |
| 2007/0284993 A1 | 12/2007 | Kim |
| 2008/0007966 A1 | 1/2008 | Ohkawa et al. |
| 2008/0029775 A1 | 2/2008 | Liu et al. |
| 2008/0048200 A1 | 2/2008 | Mueller et al. |
| 2008/0074886 A1 | 3/2008 | Chang |
| 2008/0303757 A1 | 12/2008 | Ohkawa et al. |
| 2009/0116245 A1 | 5/2009 | Yamaguchi |
| 2009/0225550 A1 | 9/2009 | Yamaguchi |
| 2009/0296407 A1 | 12/2009 | Bailey |
| 2010/0195335 A1* | 8/2010 | Allen ............... F21K 9/135 362/309 |
| 2010/0238669 A1 | 9/2010 | Holder et al. |
| 2013/0107544 A1 | 5/2013 | Bak |

FOREIGN PATENT DOCUMENTS

| | | |
|---|---|---|
| CN | 201265758 | 7/2009 |
| CN | 101526177 A | 9/2009 |
| DE | 197 55 734 | 6/1999 |
| DE | 10 2006 018 223 | 5/2007 |
| EP | 1 717 627 | 11/2006 |
| EP | 1 860 467 | 11/2007 |
| EP | 1 959 505 | 8/2008 |
| EP | 2 023 038 | 2/2009 |
| EP | 2 058 679 | 5/2009 |
| EP | 2 312 659 A2 | 4/2011 |
| JP | 2006-286997 | 10/2006 |
| JP | 2007-227410 A | 9/2007 |
| JP | 2009-152142 A | 7/2009 |
| JP | 2002-252373 | 9/2014 |
| KR | 10-2007-0021873 | 2/2007 |
| KR | 10-0706942 B1 | 4/2007 |
| KR | 10-0869573 | 11/2008 |
| KR | 10-0869573 B1 | 11/2008 |
| KR | 10-2009-0059877 | 6/2009 |
| KR | 10-0986468 | 10/2010 |
| WO | WO 2006/103582 | 10/2006 |
| WO | WO 2007/021149 | 2/2007 |
| WO | WO 2008/104936 | 9/2008 |
| WO | WO 2009/008636 | 1/2009 |

OTHER PUBLICATIONS

U.S. Office Action dated Apr. 8, 2016 issued in U.S. Appl. No. 14/338,812.
U.S. Office Action dated Apr. 15, 2016 issued in U.S. Appl. No. 14/855,640.
Korean Office Action dated Apr. 5, 2010 issued in Application No. 10-2009-0112479.
Korean Notice of Allowance dated Jul. 27, 2010 issued in Application No. 10-2009-0112479.
European Search Report dated Mar. 30, 2011 for Application 10191919.9.
U.S. Office Action issued in U.S. Appl. No. 12/875,671 dated May 20, 2011.
European Search Report dated Dec. 20, 2010 issued in Application No. 10 17 578.8.
EPO Communication issued in EP Application No. 10 175 788.8 dated Feb. 22, 2012.
Notice of Allowance issued in U.S. Appl. No. 13/242,860 dated Mar. 5, 2012.
U.S. Office Action issued on Aug. 14, 2012 in U.S. Appl. No. 13/531,731.
European Search Report for related application EP 12181452 dated Oct. 22, 2012.
European Office Action dated Nov. 28, 2012 for Application 10 175 788.8.
U.S. Office Action dated Apr. 11, 2013 for U.S. Appl. No. 13/719,518.
U.S. Office Action dated Jun. 12, 2013 for U.S. Appl. No. 13/759,564.
Chinese Office Action dated Feb. 13, 2014 issued in Application No. 201210367926.5 (with English translation).
Chinese Office Action for Application 201010559003.0 dated Apr. 24, 2014 and English language translation.
European Office Action dated Oct. 2, 2014 issued in Application No. 10 191 919.9.
U.S. Office Action dated Nov. 17, 2014 for U.S. Appl. No. 14/338,812.
Chinese Office Action for Application 201010559003.0 dated Jan. 9, 2015 and English language translation.
U.S. Office Action dated Apr. 21, 2015 for U.S. Appl. No. 14/338,812.
U.S. Office Action dated Jul. 6, 2015 for U.S. Appl. No. 14/338,812.
U.S. Appl. No. 14/338,812, filed Jul. 23, 2014.
U.S. Office Action issued in U.S. Appl. No. 14/338,812 dated Oct. 31, 2016.

\* cited by examiner

LIGHT EMITTING APPARATUS

CROSS-REFERENCE TO RELATED APPLICATIONS

The present application is a continuation application of U.S. application Ser. No. 14/338,812, filed Jul. 23, 2014, which is a continuation application of U.S. application Ser. No. 13/759,564, filed Feb. 5, 2013, (now U.S. Pat. No. 8,823,048, issued Sep. 2, 2014), which is a continuation application of U.S. application Ser. No. 12/949,915, filed Nov. 19, 2010 (now U.S. Pat. No. 8,395,183, issued Mar. 12, 2013), which claims priority of Korean Patent Application No. 10-2009-0112479 filed on Nov. 20, 2009, the subject matter of which are hereby incorporated by reference in its entirety.

BACKGROUND

The present disclosure relates to a light emitting apparatus.

Light emitting devices such as light emitting diodes have advantages of low power consumption, a long usable life cycle, and environmental friendly. Thus, the light emitting devices are being used for various light emitting apparatuses such as backlight units for electronic equipment, electronic displays, and lighting equipment.

In such a light emitting apparatus, an encapsulant resin layer is formed in various lens shapes to surround the light emitting device, thereby adjusting a distribution characteristic of light emitted from the light emitting device.

SUMMARY

Embodiments provide a light emitting apparatus having novel structure.

Embodiments also provide a light emitting apparatus including a lens having a novel structure.

Embodiments also provide a light emitting apparatus having a superior light emitting characteristic in a lateral direction.

In one embodiment, a light emitting apparatus comprises: a substrate; a light emitting device on the substrate; a fluorescent layer formed on the substrate and the light emitting device to surround the light emitting device; an encapsulant resin layer formed on the substrate and the fluorescent layer to surround the fluorescent layer; and a lens disposed on the light emitting device and supported by the substrate, wherein the lens includes a lens body having a first recess formed at a center of a top surface of the lens body and a second recess formed at center of a bottom surface of the lens body, and a lens supporter provided at the bottom surface of the lens body to support the lens body such that the lens body is spaced apart from the substrate.

In another embodiment, a light emitting apparatus comprises: a substrate; a light emitting device on the substrate; a fluorescent encapsulant layer formed on the substrate and the light emitting device to surround the light emitting device; and a lens disposed on the light emitting device and supported by the substrate, wherein the lens includes a lens body having a first recess formed at a center of a top surface of the lens body and a second recess formed at a center of a bottom surface of the lens body, and a lens supporter provided at the bottom surface of the lens body to support the lens body such that the lens body is spaced apart from the substrate.

The details of one or more embodiments are set forth in the accompanying drawings and the description below. Other features will be apparent from the description and drawings, and from the claims.

DETAILED DESCRIPTION OF THE EMBODIMENTS

Figure 1:
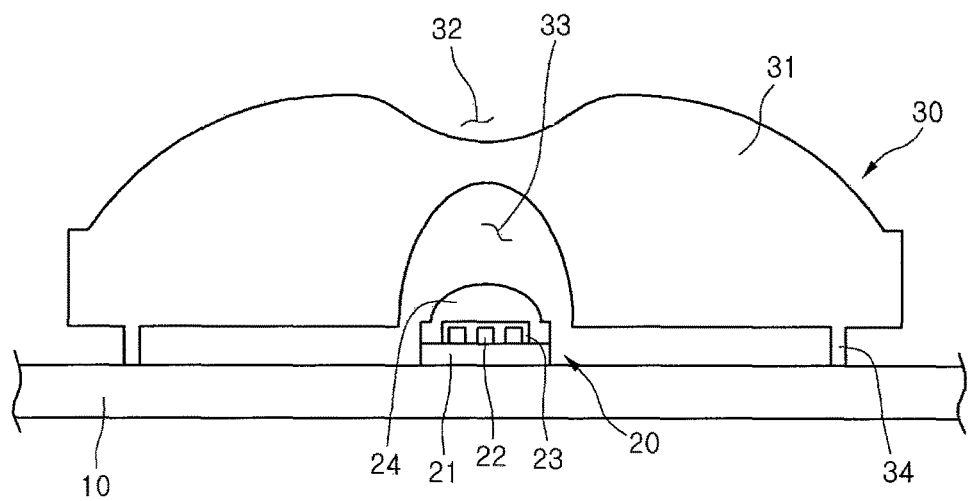
FIGS. 1 and 2 are sectional views of a light emitting apparatus according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'.

In the drawings, the thickness or size of each layer is exaggerated, omitted, or schematically illustrated for convenience in description and clarity. Also, the size of each element does not entirely reflect an actual size.

Figure 2:
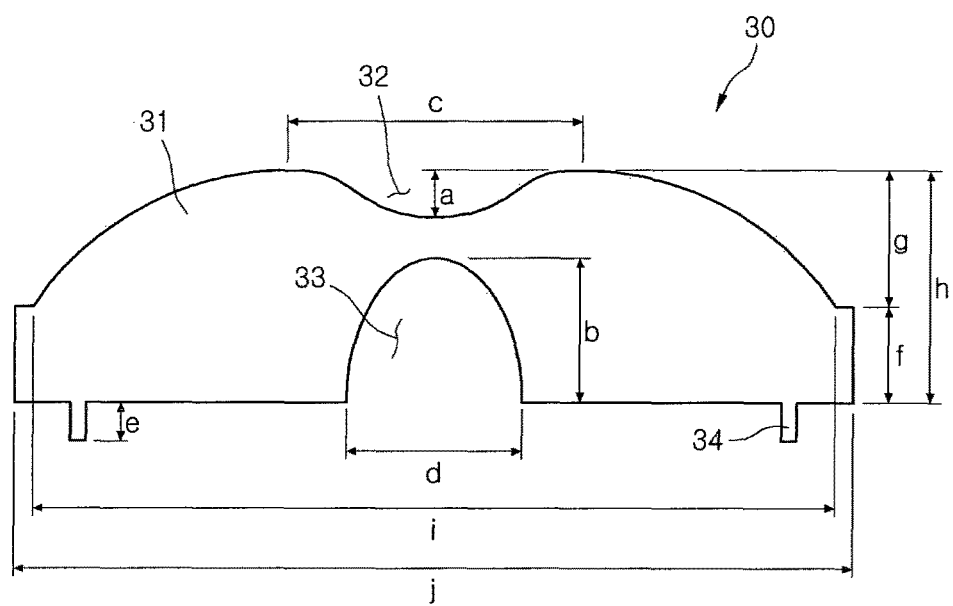

FIGS. 1 and 2 are sectional views of a light emitting apparatus according to a first embodiment.

Referring to FIGS. 1 and 2, a light emitting apparatus according to the first embodiment includes a substrate 10, a light emitting device package 20 disposed on the substrate 10, and a lens 30 disposed on the substrate 10 above the light emitting device package 20 while being supported by the substrate 10.

The substrate 10 may be a printed circuit board (PCB). A circuit pattern (not shown) is disposed on the substrate 10, and the circuit pattern and the light emitting device package 20 are electrically connected to each other.

The light emitting device package 20 includes a package body 21, at least one light emitting device 22 disposed on the package body 21, a fluorescent layer 23 surrounding the light emitting device 22, and an encapsulant resin layer 24 surrounding the fluorescent layer 23 on the package body 21.

Electrode layers (not shown) are disposed on the package body 21. The electrode layers may pass through the package body 21 or may be disposed on a surface of the package body 21 to electrically connect the light emitting device 22 to the circuit pattern of the substrate 10. The package body 21 may be formed of various materials. For example, the package body 21 may be formed of one of a ceramic material, a resin material, and a silicon material.

The light emitting device 22 may include a light emitting diode. The light emitting device 22 may be provided in plurality on the package body 21. In this embodiment, three light emitting devices 22 are provided. The plurality of light emitting devices 22 may be connected to each other in parallel or series. Also, the plurality of light emitting devices 22 may be electrically connected to the electrode layers using a flip-chip method or a wire bonding method.

A light emitting diode emitting at least one of red light, green light, and blue light may be used as the light emitting device 22. In this embodiment, the light emitting diode emitting the blue light is illustrated as an example.

The fluorescent layer 23 may surround the light emitting device 22 on the package body 21. For example, the fluorescent layer 23 may contain a yellow luminescence material. The fluorescent layer 23 may have a flat top surface and a constant height on the package body 21.

The encapsulant resin layer 24 is disposed on the package body 21 to surround the fluorescent layer 23. The encapsulant resin layer 24 may be formed of a transparent resin material, for example, an epoxy resin or a silicon resin.

The encapsulant resin layer 24 may have a convex structure at the center of the top surface thereof. Also, the encapsulant resin layer 24 may be flat at a circumference of the top surface thereof.

The lens 30 includes a lens body 31 and a lens support 34 supporting the lens body 31. The lens body 31 and the lens support 34 may be integrated with each other using an injection molding. Alternatively, the lens body 31 and the lens support 34 may be provided as separate parts, and then coupled to each other using an adhesive.

The lens body 31 may have an approximately circular shape when viewed in a plan view. A concavo-convex or roughness may be formed on a bottom surface of the lens body 31. The concavo-convex section or a roughness may be formed on the bottom surface of the lens body 31 except for a region where the second recess 33 is formed.

The lens support 34 may be provided in plurality on the bottom surface of the lens body 31. Although only two lens supports 34 are illustrated in this embodiment, the present disclosure is not limited thereto. For example, three or more lens supports 34 may be disposed spaced apart from each other to stably support the lens body 31. A configuration or number of the lens support 34 may be variously modified according to its design.

The lens body 31 may be formed of a transparent resin material. Also, the lens body 31 may be spaced a predetermined distance from the substrate 10 by the lens support 34. The lens support 34 may be firmly attached to the substrate 10 using an adhesive.

The lens body 31 has a protruding top surface on the whole. A downwardly concave first recessed part 32 is disposed at a central portion of the top surface of the lens body 31. Also, the lens body 31 has a flat bottom surface. An upward concave second recessed part 33 is disposed at a central portion of the bottom surface of the lens body 31. The first recessed part 32 and the second recessed part 33 vertically overlap each other.

Since the first recessed part 32 and the second recessed part 33 are disposed at the central portion of the lens body 31, the lens body 31 has a thin thickness at the central portion thereof. The lens body 31 has a thickness which becomes gradually thicker from the central portion toward an edge portion and then thinner again. Also, a circumference of the top surface of the lens body 31 may be flat, and a lateral surface adjacent to the bottom surface of the lens body 31 may be perpendicular to the bottom surface of the lens body 31.

The first recessed part 32 may have a maximum depth (a) of about 0.3 mm to about 0.4 mm. The second recessed part 33 may have a maximum depth (b) of about 2.5 mm to about 3 mm. Also, the first recessed part 32 may have a maximum width (c) of about 3.5 mm to about 4 mm. The second recessed part 33 may have a maximum width (d) of about 2.8 mm to about 3.3 mm.

The lens support 34 may have a maximum thickness (e) of about 0.5 mm to about 0.8 mm.

The lens body 31 may have a maximum thickness (h) of about 4 mm to about 5 mm. A maximum thickness (f) from the bottom surface of the lens body 31 to the flat top surface may range from about 1.8 mm to about 2 mm. A thickness (g) from the flat top surface of the lens body 31 to a top surface may range from about 2.2 mm to about 2.8 mm.

The lens body 31 may have a maximum width (j) of about 13 mm to about 19 mm. The lens body may have a maximum width (i) of about 12 mm to about 18 mm at a portion in which the top surface of the lens body 31 is curved.

In the light emitting device package 20, the package body 21 may have a maximum thickness of about 0.3 mm to about 0.4 mm, and a maximum height from the top surface of the package body 21 to a top surface of the encapsulant resin layer 24 may range from about 1.1 mm to about 1.5 mm.

In this embodiment, a ratio (a/h) of the maximum depth (a) of the first recessed part 32 to the maximum thickness (h) of the lens body 31 may range from about 0.06 to about 0.1. A ratio (b/h) of the maximum depth (b) of the second recessed part 33 to the maximum thickness (h) of the lens body 31 may range from about 0.5 to 0.75. A ratio (b/a) of the maximum depth (b) of the second recessed part 33 to the maximum depth (a) of the first recessed part 32 may range from about 6.25 to about 10.

A ratio (c/j) of the maximum width (c) of the first recessed part 32 to the maximum width (j) of the lens body 31 may range from about 0.18 to about 0.3. A ratio (d/j) of the maximum width (d) of the second recessed part 33 to the maximum width (j) of the lens body 31 may range from about 0.14 to about 0.25. A ratio (d/c) of the maximum width (d) of the second recessed part 33 to the maximum width (c) of the first recessed part 32 may range from about 0.7 to about 0.94.

At least a portion of the encapsulant resin layer 24 is disposed within the second recessed part 33. The package body 21 has the maximum thickness less than that of the lens support 34. The bottom surface of the lens body 31 may be flush with the light emitting device 22 or the fluorescent layer 23 or flush with the encapsulant resin layer 24. The encapsulant resin layer 24 may be completely separated from the lens body 31.

As above-described, the light emitting apparatus has superior light emitting efficiency in a lateral direction. Light emitted from the light emitting device 22 is reflected and refracted by the encapsulant resin layer 24 and reflected and refracted by the second recessed part 33 to emit a large amount of the light in the lateral direction. Specifically, the first recessed part 32 and the second recessed part 33 reduce an amount of light emitted in an upper direction.

Figure 7:
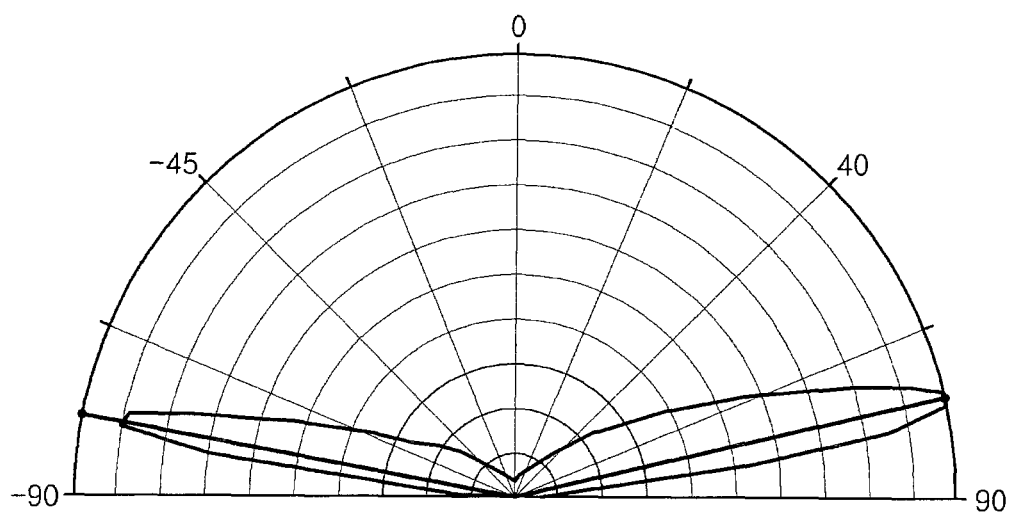
FIGS. 7 and 8 are views illustrating a light distribution characteristic of the light emitting apparatus according to the first embodiment.
Figure 8:
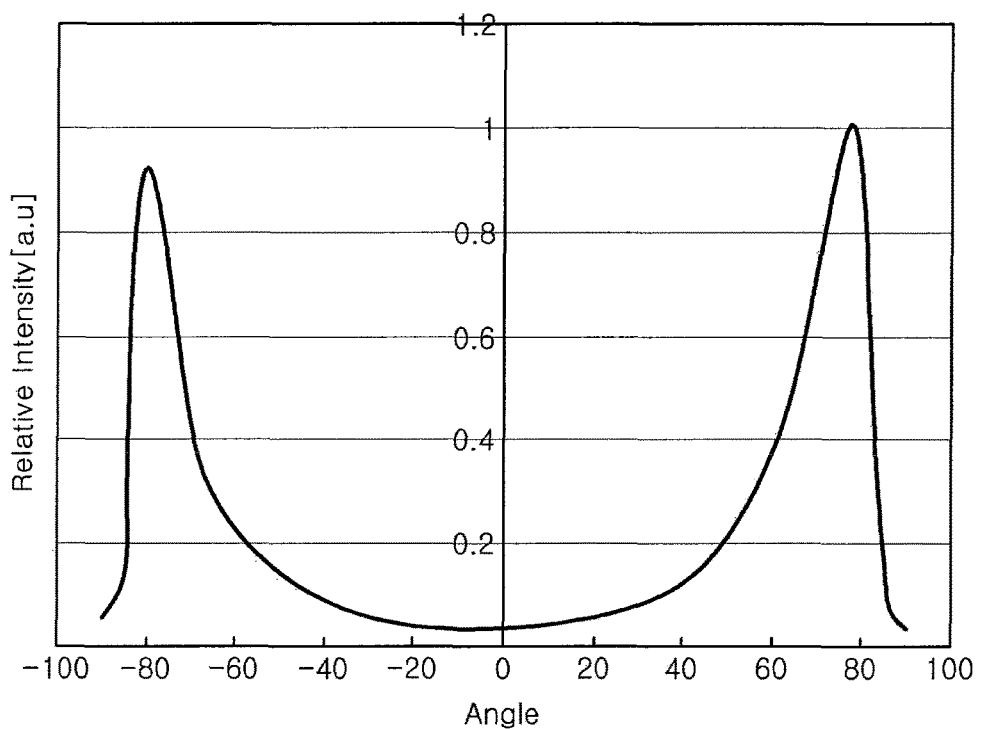

FIGS. 7 and 8 are views illustrating a light distribution characteristic of the light emitting apparatus according to the first embodiment.

Referring to FIGS. 7 and 8, the light emitting apparatus according to the first embodiment emits a peak light at an angle of about 70° to about 85° or about −70° to about −85° when an angle perpendicular to the substrate 10 is defined as 0°. That is, it may be seen that the light emitted from the light emitting apparatus is mainly emitted in the lateral direction.

Light emitting apparatuses according to second to seventh embodiments, which will be described below, have light distribution characteristics similar to light distribution characteristics of the light emitting apparatus shown in FIGS. 7 and 8.

Figure 3:
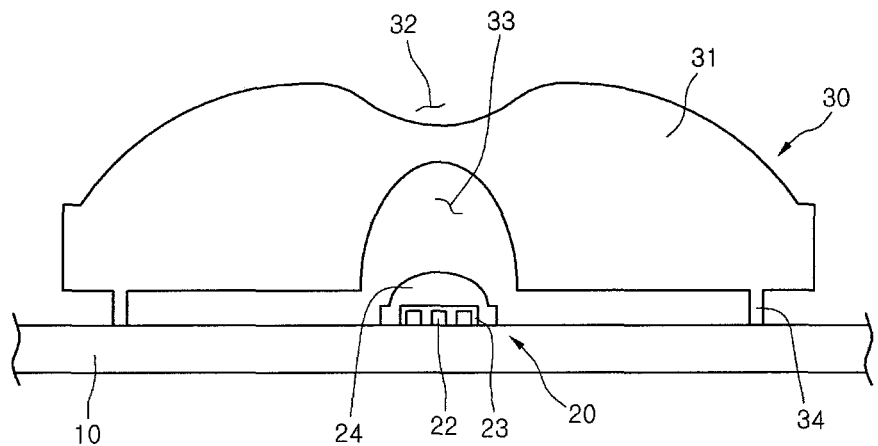
FIG. 3 is a sectional view of a light emitting apparatus according to a second embodiment.

FIG. 3 is a sectional view of a light emitting apparatus according to a second embodiment.

In descriptions of a light emitting apparatus according to a second embodiment, descriptions that duplicate those for the light emitting apparatus according to the first embodiment will be omitted.

Referring to FIG. 3, the light emitting apparatus according to a second embodiment is formed through the COB (chip on board) method. The light emitting device 22 is directly mounted on the substrate 10, and the fluorescent layer 23 is formed on the substrate 10 to surround the light emitting device 22. In addition, the encapsulant resin layer 24 is formed on the substrate 10 to surround the fluorescent layer 23. The encapsulant resin layer 24 comes into contact with the substrate 10 and a part of the encapsulant resin layer 24 is disposed in the second recessed part 33.

Different from the light emitting apparatus according to the first embodiment, according to the second embodiment, the light emitting device 22 is directly mounted on the substrate 20 without being packaged by using the package body 21. Thus, the light generated from the light emitting device 22 can be emitted with wider orientation angle and the heat generated from the light emitting device 22 can be effectively dissipated to the outside.

Figure 4:
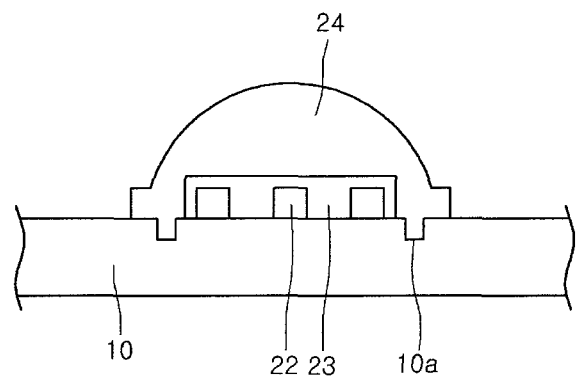
FIG. 4 is a sectional view of a light emitting device package in a light emitting apparatus according to a third embodiment.

FIG. 4 is a sectional view of a light emitting device package in a light emitting apparatus according to a third embodiment.

In descriptions of a light emitting apparatus according to a third embodiment, descriptions that duplicate those for the light emitting apparatus according to the first and second embodiments will be omitted. The lens is omitted in FIG. 4.

Referring to FIG. 4, the light emitting apparatus according to a third embodiment is formed through the COB method. The light emitting device 22 is directly mounted on the substrate 10, and the fluorescent layer 23 is formed on the substrate 10 and the light emitting device 22 to surround the light emitting device 22. In addition, the encapsulant resin layer 24 is formed on the substrate 10 and the fluorescent layer 23 to surround the fluorescent layer 23. A part of the encapsulant resin layer 24 is disposed in the second recessed part 33.

A concave part 10a is formed in the substrate 10 and the encapsulant resin layer 24 is filled in the concave part 10a. Therefore, a contact area between the encapsulant resin layer 24 and the substrate 10 is increased, so that the encapsulant resin layer 24 can be firmly coupled to the substrate 10 and the fluorescent layer 23.

Figure 5:
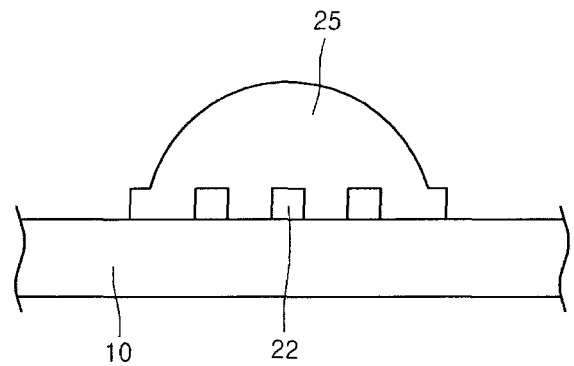
FIG. 5 is a sectional view of a light emitting device package in a light emitting apparatus according to a fourth embodiment.

FIG. 5 is a sectional view of a light emitting device package in a light emitting apparatus according to a fourth embodiment.

In descriptions of a light emitting apparatus according to a fourth embodiment, descriptions that duplicate those for the light emitting apparatus according to the first and second embodiments will be omitted.

Referring to FIG. 5, the light emitting apparatus according to a fourth embodiment is formed through the COB method. The light emitting device 22 is directly mounted on the substrate 10, and a fluorescent encapsulant layer 25 is formed on the substrate 10 and the light emitting device 22 to surround the light emitting device 22.

The fluorescent encapsulant resin layer 25 is prepared in a convex shape by dispensing an encapsulant resin layer including luminescence materials distributed therein. The fluorescent encapsulant resin layer 25 has the functions of the fluorescent layer and the encapsulant layer. Thus, the manufacturing process for the light emitting apparatus according to the fourth embodiment can be simplified.

Figure 6:
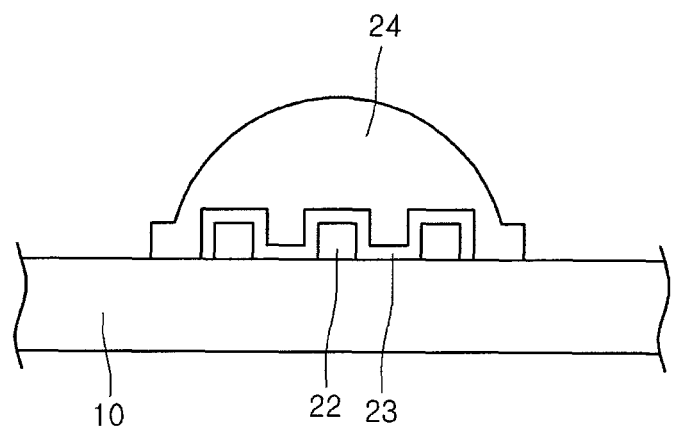
FIG. 6 is a sectional view of a light emitting device package in a light emitting apparatus according to a fifth embodiment.

FIG. 6 is a sectional view of a light emitting device package in a light emitting apparatus according to a fifth embodiment.

In descriptions of a light emitting apparatus according to a fifth embodiment, descriptions that duplicate those for the light emitting apparatus according to the first and second embodiments will be omitted. The lens is omitted in FIG. 6.

Referring to FIG. 6, the light emitting apparatus according to a fifth embodiment is formed through the COB method. The light emitting device 22 is directly mounted on the substrate 10, and the fluorescent layer 23 having a predetermined thickness is formed on the substrate 10 and the light emitting device 22 to surround the light emitting device 22. In addition, the encapsulant resin layer 24 is formed on the substrate 10 and the fluorescent layer 23 to surround the fluorescent layer 23. A part of the fluorescent layer 23 is disposed in the second recessed part 33.

The fluorescent layer 23 is corrugated corresponding to the configuration of the light emitting device 22. That is, the fluorescent layer 23 disposed on the substrate 10 has a height lower than that of the fluorescent layer 23 disposed on the light emitting device 22. According to the light emitting apparatus of the fifth embodiment, the fluorescent layer 23 having predetermined thickness surrounds the light emitting device 22, so that the color variation of the light emitted from the light emitting apparatus can be diminished.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A lens comprising:
a lens body having a convex top surface and a bottom surface, the convex top surface including a first recessed part at a central portion thereof and a flat top surface at a circumference of the top surface of the lens body, the bottom surface including a second recessed part at a central portion thereof, wherein the flat top surface is disposed lower than a lowest point of the first recessed part, and the flat top surface is disposed lower than a highest point of the second recessed part; and
a plurality of lens supporters at the bottom surface of the lens body, wherein a maximum width at a portion in which the convex top surface of the lens body is curved ranges from about 12 mm to about 18 mm,
wherein a maximum width of the lens body ranges from about 13 mm to about 19 mm,
wherein a ratio of a maximum width of the second recessed part to the maximum width at the portion in which the convex top surface of the lens body is curved ranges from about 0.15 to about 0.27, and
wherein a ratio of the maximum width of the second recessed part to the maximum width of the lens body ranges from about 0.14 to about 0.25.

2. The lens according to claim 1, wherein a ratio of a maximum depth of the second recessed part to the maximum width at the portion in which the convex top surface of the lens body is curved ranges from about 0.14 to about 0.25.

3. The lens according to claim 1, wherein a ratio of a maximum depth of the second recessed part to the maximum width of the lens body ranges from about 0.13 to about 0.23.

4. The lens according to claim 3, wherein a ratio of a maximum depth of the second recessed part to a maximum thickness of the lens body ranges from about 0.5 to about 0.75.

5. The lens according to claim 1, wherein a maximum depth of the second recessed part is a distance from a top surface of the second recessed part to the bottom surface of the lens body, and
wherein the maximum depth of the second recessed part ranges from about 2.5 mm to about 3 mm.

6. The lens according to claim 1, wherein a maximum thickness of the lens body is a distance from a top surface of the lens body to the bottom surface of the lens body, and
wherein the maximum thickness of the lens body ranges from about 4 mm to about 5 mm.

7. The lens according to claim 1, wherein the maximum width of the second recessed part is the longest distance between two points at a bottom surface of the second recessed part, and
wherein the maximum width of the second recessed part ranges from about 2.8 mm to about 3.3 mm.

8. The lens according to claim 1, wherein a ratio of a maximum width of the first recessed part to the maximum width of the lens body ranges from about 0.18 to about 0.3.

9. The lens according to claim 1, wherein a ratio of a maximum depth of the first recessed part to a maximum thickness of the lens body ranges from about 0.06 to about 0.1.

10. The lens according to claim 9, wherein the maximum depth of the first recessed part is a distance from the top surface of the lens body to a bottom surface of the first recessed part, and
wherein the maximum depth of the first recessed part ranges from about 0.3 mm to about 0.4 mm.

11. The lens according to claim 1, wherein a ratio of the maximum depth of the second recessed part to a maximum depth of the first recessed part ranges from about 6.25 to about 10.

12. The lens according to claim 1, wherein a ratio of the maximum width of the second recessed part to a maximum width of the first recessed part ranges from about 0.7 to about 0.94.

13. The lens according to claim 1, wherein the first recessed part and the second recessed part vertically overlap each other, and
wherein the first recessed part is formed of downwardly concave shape and the second recessed part is formed of upwardly concave shape.

14. The lens according to claim 1, wherein the plurality of lens supports comprises at least three or more lens supporters.

15. A light emitting apparatus comprising:
a substrate;
a light emitting device on the substrate; and
a lens disposed on the light emitting device and supported by the substrate,
wherein the lens comprises a lens body and a plurality of lens supporters at a bottom surface of the lens body,
wherein the lens body includes a convex top surface and the bottom surface, the convex top surface including a first recessed part at a central portion thereof and a flat top surface at a circumference of the top surface of the lens body, the bottom surface including a second recessed part at a central portion thereof, wherein the flat top surface is disposed lower than a lowest point of the first recessed part, and the flat top surface is disposed lower than a highest point of the second recessed part,
wherein a maximum width at a portion in which the convex top surface of the lens body is curved ranges from about 12 mm to about 18 mm,
wherein a maximum width of the lens body ranges from about 13 mm to about 19 mm,
wherein a ratio of a maximum width of the second recessed part to the maximum width at the portion in which the convex top surface of the lens body is curved ranges from about 0.15 to about 0.27, and
wherein a ratio of the maximum width of the second recessed part to the maximum width of the lens body ranges from about 0.14 to about 0.25.

16. The light emitting apparatus according to claim 15, wherein a ratio of a maximum depth of the second recessed part to the maximum width at the portion in which the convex top surface of the lens body is curved ranges from about 0.14 to about 0.25.

17. The light emitting apparatus according to claim 15, wherein a ratio of a maximum depth of the second recessed part to the maximum width of the lens body ranges from about 0.13 to about 0.23.

18. The light emitting apparatus according claim 15, further comprising a fluorescent layer provided on the substrate and the light emitting device to surround the light emitting device, and
an encapsulant resin layer provided on the substrate and the fluorescent layer to surround the fluorescent layer.

19. The light emitting apparatus according to claim 15, wherein the light emitting device is provided under the second recessed part.

20. A light unit comprising:
a printed circuit board;
a light emitting device directly mounted on the printed circuit board; and
a lens disposed on the light emitting device and supported by the printed circuit board,
wherein the lens comprises a lens body and a plurality of lens supporters at a bottom surface of the lens body,
wherein the lens body includes a convex top surface and the bottom surface, the convex top surface including a first recessed part at a central portion thereof and a flat top surface at a circumference of the top surface of the lens body, the bottom surface including a second recessed part at a central portion thereof, wherein the flat top surface is disposed lower than a lowest point of the first recessed part, and the flat top surface is disposed lower than a highest point of the second recessed part, wherein a maximum width at a portion in which the convex top surface of the lens body is curved ranges from about 12 mm to about 18 mm, wherein a maximum width of the lens body ranges from about 13 mm to about 19 mm, wherein a ratio of a maximum width of the second recessed part to the maximum width at the portion in which the convex top surface of the lens body is curved ranges from about 0.15 to about 0.27, and wherein a ratio of the maximum width of the second recessed part to the maximum width of the lens body ranges from about 0.14 to about 0.25.

* * * * *